(12) United States Patent
Sui et al.

(10) Patent No.: US 12,114,558 B2
(45) Date of Patent: Oct. 8, 2024

(54) FLEXIBLE SUBSTRATE, PREPARATION METHOD THEREFOR, DISPLAY PANEL, AND DISPLAY DEVICE

(71) Applicant: BOE TECHNOLOGY GROUP CO., LTD., Beijing (CN)

(72) Inventors: Kai Sui, Beijing (CN); Jinxiang Xue, Beijing (CN); Zhongyuan Sun, Beijing (CN); Xiaofen Wang, Beijing (CN); Qian Jin, Beijing (CN); Chao Dong, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 759 days.

(21) Appl. No.: 17/262,768

(22) PCT Filed: Jun. 23, 2020

(86) PCT No.: PCT/CN2020/097575
§ 371 (c)(1),
(2) Date: Jan. 25, 2021

(87) PCT Pub. No.: WO2020/259462
PCT Pub. Date: Dec. 30, 2020

(65) Prior Publication Data
US 2021/0313526 A1    Oct. 7, 2021

(30) Foreign Application Priority Data
Jun. 25, 2019   (CN) .......................... 201910556319.5

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 71/00* (2023.02); *H10K 2102/311* (2023.02)

(58) Field of Classification Search
CPC ............... H10K 77/111; H10K 59/131; H10K 2102/311
See application file for complete search history.

(56) References Cited

U.S. PATENT DOCUMENTS

| | | | |
|---|---|---|---|
| 9,391,286 B1 | 7/2016 | Kwon et al. | |
| 2012/0062447 A1* | 3/2012 | Tseng | G02F 1/133305 345/33 |

(Continued)

FOREIGN PATENT DOCUMENTS

| | | |
|---|---|---|
| CN | 108933148 A | 12/2018 |
| CN | 109643196 A | 4/2019 |

(Continued)

OTHER PUBLICATIONS

Definition of "elastic", retrieved from http://www.merriam-webster.com (2023) (Year: 2023).*

(Continued)

*Primary Examiner* — Michele Fan
(74) *Attorney, Agent, or Firm* — Chiwin Law LLC (57) ABSTRACT

A flexible substrate, a preparation method therefor, a display panel, and a display device. The flexible substrate includes a flexible substrate, and the flexible substrate includes a plurality of display regions arranged in an array and bridges connecting every two adjacent display regions. Each of the display regions is provided with a pixel structure. Each of the bridges includes a buffer layer, a first organic layer, a wiring layer, a second organic layer, and an inorganic layer arranged in sequence. A wire is disposed in the wiring layer. At least part of the wire includes alternately arranged metal (Continued)

segments and elastic conductor segments in the direction of extension of the wire.

20 Claims, 8 Drawing Sheets

(51) Int. Cl.
*H10K 71/00* (2023.01)
*H10K 102/00* (2023.01)

(56) References Cited

U.S. PATENT DOCUMENTS

| 2014/0217397 | A1 | | 8/2014 | Kwak et al. | |
|---|---|---|---|---|---|
| 2018/0114825 | A1 | * | 4/2018 | Hong | H10K 77/10 |
| 2020/0051964 | A1 | * | 2/2020 | Jung | H01L 25/162 |
| 2020/0243778 | A1 | * | 7/2020 | Li | H10K 77/111 |

FOREIGN PATENT DOCUMENTS

| CN | 109659337 | A | 4/2019 |
|---|---|---|---|
| CN | 109712536 | A | 5/2019 |
| CN | 109817687 | A | 5/2019 |
| CN | 109830510 | A | 5/2019 |
| CN | 110137239 | A | 8/2019 |

OTHER PUBLICATIONS

First office action issued in Chinese Patent Application No. 201910556319.5 with search report.

* cited by examiner

_(54)_ FLEXIBLE SUBSTRATE, PREPARATION METHOD THEREFOR, DISPLAY PANEL, AND DISPLAY DEVICE

CROSS REFERENCES TO RELATED APPLICATIONS

This application is a U.S. National Phase Entry of International Application No. PCT/CN2020/097575 filed on Jun. 23, 2020, designating the United States of America and claiming priority to Chinese Patent Application No. 201910556319.5, filed on Jun. 25, 2019. The present application claims priority to and the benefit of the above-identified applications and the above-identified applications are incorporated by reference herein in their entirety for all purposes.

TECHNICAL FIELD

Embodiments of the present disclosure relate to a flexible substrate, a preparing method thereof, a display panel, and a display device.

BACKGROUND

With the development of OLED (Organic Light-Emitting Diode) display technology, the flexible display technology has become possible.

At present, a solution of realizing a bendable flexible screen usually includes providing islands (display region) and bridges connecting every two adjacent islands, on a flexible substrate. The islands are used for arranging pixel structures, and the bridges are provided with connecting wires (usually named metal wires) which connect adjacent pixel structures to transmit signals or currents. When the screen is bent, patterned bridges between the islands are deformed to change relative positions of the islands.

However, in the existing technology, during a bending process of the bridge, the wire made of a metallic material is prone to generate cracks due to tensile stress or compressive stress, and the wire is prone to peel off from film layers at both sides thereof.

SUMMARY

Embodiments of the present disclosure provides a flexible substrate, a method of preparing the flexible substrate, a display panel, and a display device.

At least one embodiment of the present disclosure provides a flexible substrate, comprising a flexible base substrate, the flexible base substrate comprising a plurality of display regions in an array and bridges connecting every two adjacent display regions. Each of the plurality of display regions is configured to arrange a pixel structure; each of the bridges comprises a buffer layer, a first organic layer, a wiring layer, a second organic layer, and an inorganic layer that are arranged in sequence. The wiring layer is provided with a wire; and in at least a part of a length of the wire, along an extension direction of the wire, the wire comprises metal segments and elastic conductor segments that are alternately arranged.

For example, each of the bridges comprises a bent portion and a linear extension portion, wherein a part of the wire in the bent portion comprises the metal segments and the elastic conductor segments that are alternately arranged, and a part of the wire in the linear extension portion is formed by a continuous metal wire.

For example, ends of each metal segment extends into a corresponding one of the elastic conductor segments.

For example, the elastic conductor segments have a cross-sectional area larger than a cross-sectional area of the metal segments.

For example, the cross-sectional area of the elastic conductor segments is 3.5 times to 4.5 times of the cross-sectional area of the metal segments.

For example, each elastic conductor segment comprises an organic conductor and conductive particles distributed in the organic conductor.

For example, the organic conductor comprises at least one of a conductive rubber or a conductive resin; and the conductive particles comprise at least one of silver nanoparticles, gold nanoparticles, silver nanowires, Ir—Sn nanowires, Ir—Ag nanotubes, Pt—Sn nanowires, or zinc nanowires.

For example, along the extension direction of the wire, a ratio of a size of the metal segments to a size of the elastic conductor segments ranges from 0.9 to 1.5.

For example, along the extension direction of the wire, a size of the metal segments ranges from 1.0 µm to 6.0 µm, and a size of the elastic conductor segments ranges from 1.0 µm to 6.0 µm; along a direction perpendicular to the extension direction of the wire and a direction perpendicular to an arrangement direction of the first organic layer and the second organic layer, the size of the metal segments ranges from 1.0 µm to 6.0 µm, and the size of the elastic conductor segments ranges from 2.4 µm to 4 µm; and along the arrangement direction of the first organic layer and the second organic layer, the size of the metal segments ranges from 300 nm to 1200 nm, and the size of the elastic conductor segments ranges from 1.2 µm to 2.4 µm.

At least one embodiment also provides a method of preparing a flexible substrate, comprising: providing a flexible base substrate, the flexible base substrate being formed with a plurality of display regions in an array; forming a bridge region between every two adjacent display regions; sequentially forming a buffer layer and a first organic layer on a portion of the flexible base substrate corresponding to the bridge region; forming a plurality of groups of metal segments on the first organic layer, each of the plurality of groups of metal segments comprises a plurality of metal segments spaced apart along an extension direction of the bridge region; forming a first sub-organic layer on the first organic layer, the first sub-organic layer covers each group of metal segments; in each group of metal segments, removing a portion of the first sub-organic layer between every two adjacent metal segments to form a first groove; forming an elastic conductor segment in the first groove to connect two adjacent metal segments; forming a second organic sub-layer on a surface of the first organic sub-layer, the second organic sub-layer covers the elastic conductor segment, and the first organic sub-layer and the second organic sub-layer form a second organic layer; and forming an inorganic layer on a surface of the second sub-organic layer.

For example, over-etching the first organic layer during forming the first groove, so as to form an undercut structure at both ends of each metal segment along the extension direction of the bridge region.

For example, along an extension direction of the wire, the first groove has a size ranging from 1.0 µm to 6.0 µm; along a direction perpendicular to the extension direction of the wire and a direction perpendicular to an arrangement direction of the first organic layer and the second organic layer, the size of the first groove is 2.4 µm-4 µm; and along the arrangement direction of the first organic layer and the second organic layer, the size of the first groove ranges from 1.2 μm to 2.4 μm.

At least one embodiment of the present disclosure also provides a method of preparing a flexible substrate, comprising: providing a flexible base substrate, the flexible base substrate being formed with a plurality of display regions in an array; forming a bridge region between every two adjacent display regions; sequentially forming a buffer layer and a first organic layer on a portion of the flexible base substrate corresponding to the bridge region; forming a plurality of groups of elastic conductor segments on the first organic layer, each of the plurality of groups of elastic conductor segments comprises a plurality of elastic conductor segments spaced apart along an extension direction of the bridge region; forming a third sub-organic layer on the first organic layer, the third sub-organic layer covers each group of elastic conductor segments; in each group of elastic conductor segments, removing a portion of the third sub-organic layer between every two adjacent elastic conductor segments to form a second groove; forming a metal segment in the second groove to connect two adjacent elastic conductor segments; forming a fourth sub-organic layer on a surface of the third sub-organic layer, the fourth sub-organic layer covers the metal segment, and the third sub-organic layer and the fourth sub-organic layer form a second organic layer; and forming an inorganic layer on a surface of the fourth sub-organic layer.

At least one embodiment of the present disclosure also provides a display panel, comprising the flexible substrates.

At least one embodiment of the present disclosure also provides a display device, comprising the display panel.

BRIEF DESCRIPTION OF THE DRAWINGS

The embodiments of the present disclosure will be described in more detail below in conjunction with the accompanying drawings, so that those of ordinary skill in the art can understand the embodiments of the present disclosure more clearly. In the drawings.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the absolute position of the object which is described is changed, the relative position relationship may be changed accordingly.

Figure 1A:
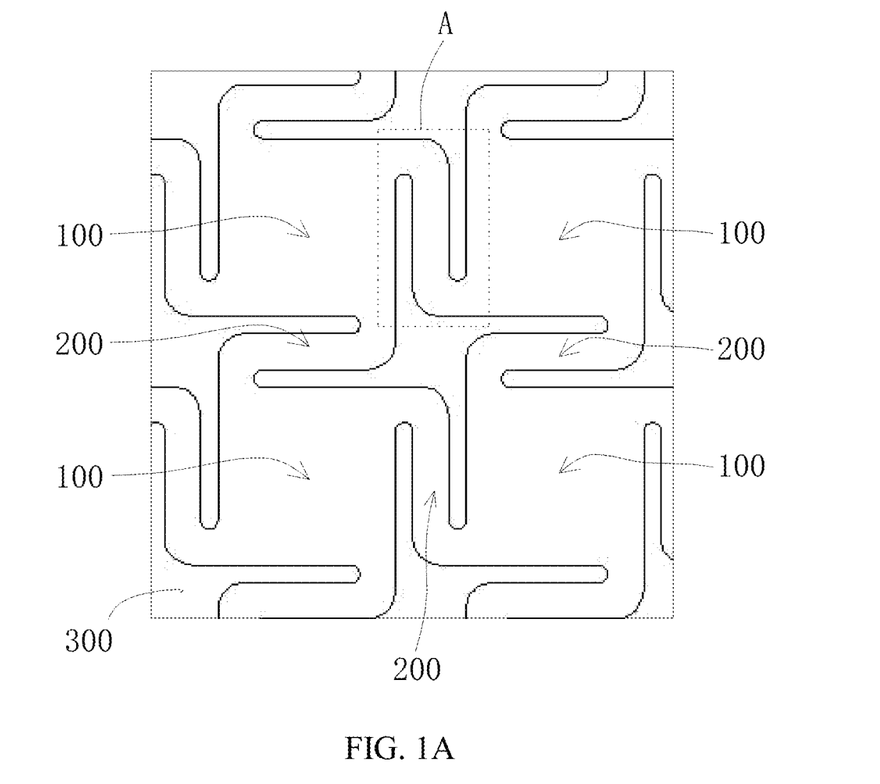
FIG. 1A is a schematic diagram illustrating a partial structure of a flexible substrate provided by an embodiment of the present disclosure.
Figure 1B:
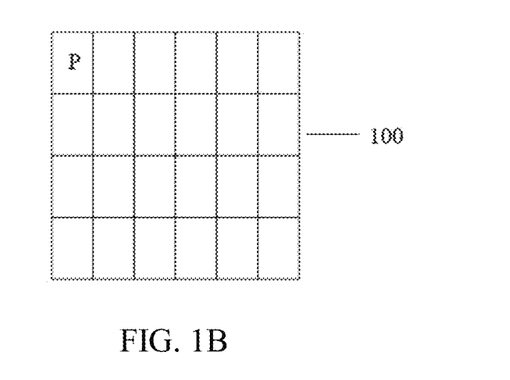
FIG. 1B illustrates a pixel structure in a pixel unit.

As shown in FIG. 1A, the flexible substrate provided by the embodiment of the present application includes a flexible substrate including a flexible base substrate 300, the flexible base substrate 300 includes a plurality of display regions 100 arranged in an array. The display region 100 is configured for arrangement of pixel structure. The pixel structure may include a plurality of pixel units P, as shown in FIG. 1B.

A bridge 200 is connected between every two adjacent display regions 100. Referring to FIG. 1A, one bridge 200 is provided between every two adjacent display regions 100 along a row direction, and one bridge 200 is provided between every two adjacent display regions 100 along a column direction. It should be understood that the amount of the bridges between every two adjacent display regions 100 is not limited, and it may be one or two or more.

Figure 4:
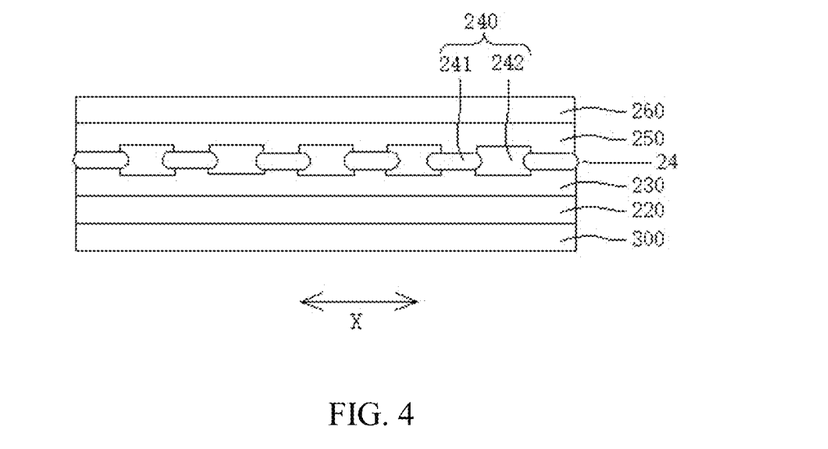
FIG. 4 is a cross-sectional view along B-B direction of FIG. 2.

Furthermore, referring to FIG. 4, the bridge 200 includes a buffer layer 220, a first organic layer 230, a wiring layer 24, a second organic layer 250, and an inorganic layer 260 that are sequentially arranged. The wiring layer 24 is provided with a wire 240 therein.

In at least a part of a length of the wire 240, along an extension direction of the wire 240, the wire 240 includes metal segments 241 and elastic conductor segments 242 that are alternately arranged.

The buffer layer 220 and the inorganic layer 260 can prevent water vapor from entering the wiring layer 24 to change conductive properties of the wire 240.

Figure 3:
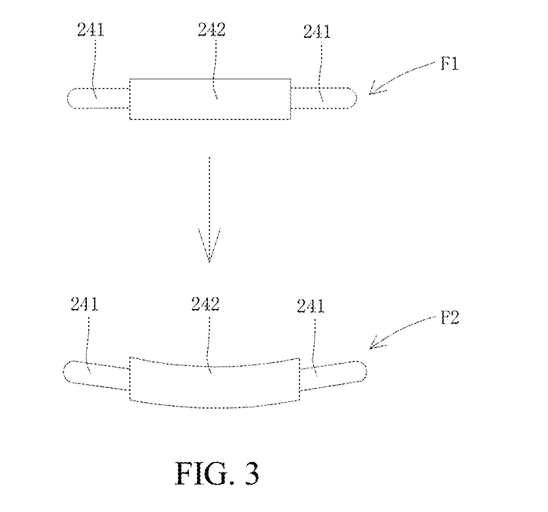
FIG. 3 is a schematic diagram illustrating states of a wire in a flexible substrate provided by an embodiment of the present disclosure before the wire is subjected to a force and after the wire is subjected to the force.

In the above-mentioned flexible substrate, and with reference to FIG. 3, because at least a part of the length of the wire 240 includes metal segments 241 and elastic conductor segments 242 that are alternately arranged, when the flexible substrate is bent, the bridge 200 is bent and deformed, the wire 240 in the bridge 200 is bent, and a relative position between two adjacent metal segments 241 is changed with a bending angle of the elastic conductor segment 242. Because the elastic conductor segment 242 has good flexibility, it can release the tensile stress or compressive stress caused by bending the bridge 200, so as to avoid the technical problem that the wires 240 in the bridges 200 are prone to generate cracks due to the bending of the flexible screen; at the same time, the metal segment 241 is arranged between the elastic conductor segments 242, because the metal segment 241 has a higher electrical conductivity with respect to the conductor segment 242, it can ensure that the bridge 200 does not break when the bridge 200 is bent, and meanwhile the portions of the wire 240 in which the metal segments 241 and the elastic conductor segments 242 are alternately distributed in the wiring layer 24 can have good conductivity. In addition, because at least a part of the length of the wire 240 has the elastic conductor segments 242, the elastic conductor segments 242 have better adhesiveness with the first organic layer 230 on one side of the wiring layer 24 and with the second organic layer 250 on the other side of the wiring layer 24, as compared to the metal segments 241. In this way, when the bridge 200 is bent under a force, the elastic conductor segments 242 make the conductor difficult to peel off from the first organic layer 230 and the second organic layer 250.

The shape of the bridges 200 is not limited. Each bridge 200 includes a bent portion and a linear extension portion. A part of the wire 240 in the bent portion includes metal segments 241 and elastic conductor segments 242 that are alternately arranged; and a part of the wire 240 in the linear extension portion is formed by a continuous metal wire or may be formed by metal segments 241 and elastic conductor segments 242 that are alternately arranged.

Figure 2:
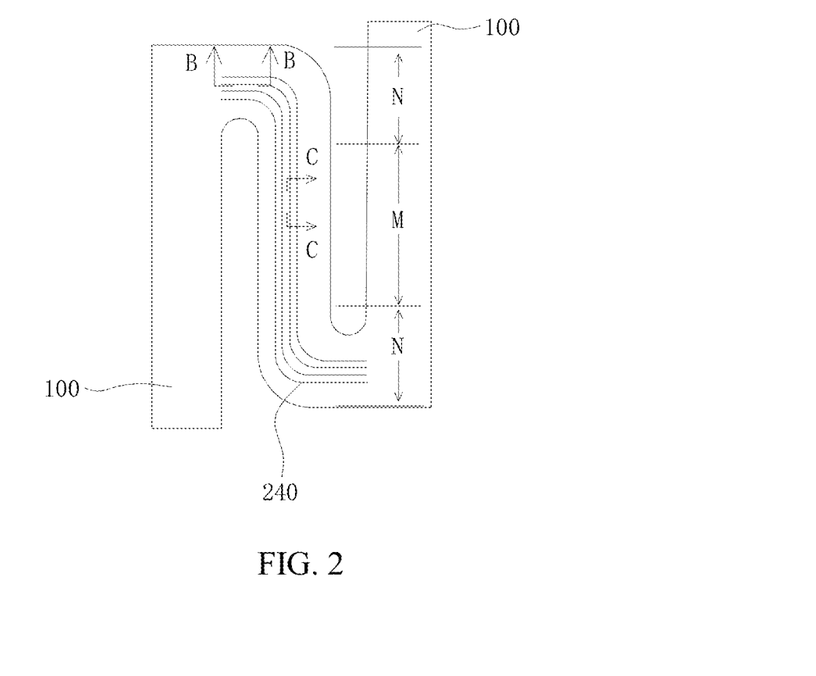
FIG. 2 is a partially enlarged view of a portion "A" in FIG. 1A.

For example, a bridge 200 between a left display region 100 and a right display region 100 is described by way of example. As shown in FIG. 2, the bridge 200 includes: a curved portion N (for example, it may be in an arc shape as shown in FIG. 2 or a curved curve of other shapes) which is connected to a top end of a right side of the left display region 100 and is opened towards the left display region 100; a curved portion N (for example, it may be in an arc shape as shown in FIG. 2 or a curved curve of other shapes) which is connected to a bottom end of the right display region 100 and is opened towards the right display region 100; and a linear extension portion M connecting the two curved portions N.

Figure 5:
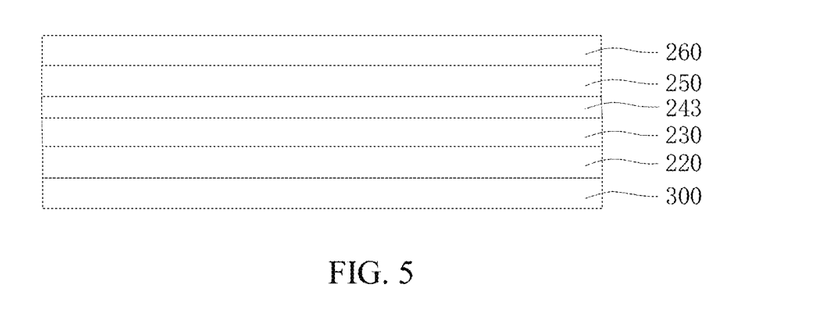
FIG. 5 is a cross-sectional view along C-C direction of FIG. 2.

As shown in FIG. 2, the wires 240 in the bent portion N are curved, and the wires 240 in the linear extension portion M extend along a straight line. As shown in FIG. 4, each wire 240 in the bent portion N includes metal segments 241 and elastic conductor segments 242 that are alternately arranged. While as shown in FIG. 5, the wire 240 in the linear extension portion M is formed by a continuous metal wire 243. The above arrangements have at least the following advantages: when the flexible screen is bent, the tensile stress or compressive stress of the bridge 200 is mainly concentrated at the bent portion N, and the bent portion is formed by alternately arranged metal segments 241 and elastic conductor segments 242, as a result, when the bent portion N is subjected to tensile stress or compressive stress, these stresses are all released due to the bending deformation of the elastic conductor segments 242, so as to prevent the wire 240 in the bent portion N from breaking. For example, as shown in FIG. 3, when the bent portion N is not subjected to tensile stress or compressive stress, as shown in the F1 state, the elastic conductor segment 242 is approximately straight; and when the bent portion N is subjected to tensile stress or compressive stress, as shown in the F2 state, the elastic conductor segment 242 between two adjacent metal segments 241 is bent due to the tensile stress or the compressive stress so as to release the stress of the wire 240 in the bent portion N, while the metal segment 241 hardly bends. In this way, the metal segments 241 are not easy to break. In addition, for example, providing the wire 240 in the linear extension portion M as a continuous metal wire is beneficial to improve the conductivity of the wire 240 in the linear extension portion M.

In addition to the above forms, for example, the bridge 200 may also adopt the following forms: the entire bridge 200 has a curved structure, e.g., the entire bridge 200 is in a circular arc shape or other curved shapes, and each of the wires 240 in the bridge 200 are all formed by metal segments 241 and elastic conductor segments 242 that are alternately arranged.

In an example, as shown in FIG. 4, along the extension direction of the bridge 200, the ends of each metal segment 241 extend into the elastic conductor segments 242, and the metal segments 241 are more firmly connected with the elastic conductor segments 242 at both ends thereof, so as to avoid the occurrence of bending deformation of the metal segments 241 and the elastic conductor segments 242 when the bridge 200 is bent and deformed.

In an example, a cross-sectional area of each elastic conductor segment 242 is greater than a cross-sectional area of each metal segment 241; because the electrical conductivity of the material of the elastic conductor segments 242 is generally lower than that of the metal segments 241, appropriately increasing the cross-sectional area of each elastic conductor segment 242 can reduce the resistance of the elastic conductor segment 242, so as to maintain the resistance of the elastic conductor segments 242 and the resistance of the metal segments 241 as consistent as possible, so that each metal segment 241 and each elastic conductor segment 242 can maximize the effects of their own conductivity performances.

For example, the cross-sectional area of each of the elastic conductor segments 242 may be 3.5 to 4.5 times of the cross-sectional area of each of the metal segments 241, for example, it may be about 3.5 times, about 3.7 times, about 4 times, about 4.3 times, or about 4.5 times, etc.

In an example, the elastic conductor segments 242 may adopt a variety of structural forms to have conductive property and conductive capability at the same time. For example, each elastic conductor segment 242 includes an organic conductor and conductive particles distributed in the organic conductor.

For example, each organic conductor includes at least one of a conductive rubber and a conductive resin; the conductive particles include at least one of silver nanoparticles, gold nanoparticles, silver nanowires, Ir—Sn nanowires, Ir—Ag nanotubes, Pt—Sn nanowires, and zinc nanowires.

In an example, along the extension direction of the wire 240, the ratio of the size of the metal segment 241 to the size of the elastic conductor segment 242 ranges from 0.9 to 1.5. As shown in FIG. 4, along the X direction, the ratio of the length of the metal segment 241 to the length of the elastic conductor segment 242 is 0.9 to 1.5, for example, it may be about 0.9, about 1.0, about 1.2, or about 1.5, etc. When the ratio of the length of the metal segment 241 to the length of the elastic conductor segment 242 is greater than 1.5 (not including this end value), the size of the metal segment 241 is too large while the length of the elastic conductor segment 242 is too small, such that, when the wire 240 is bent, a bendable size of the elastic conductor segment 242 is too small to well release the stress, and the metal segments 241 are easy to be bent with the wire 200 and hence to be broken. However, when the ratio of the length of the metal segment 241 to the length of the elastic conductor segment 242 is less than 0.9 (not including this end value), the ratio of the elastic conductor 242 in the wire 240 is too large, and the ratio of the metal conductor 241 is too small, such that the overall conductive capability of the wire 240 degrades significantly.

In an example, along the extension direction of the wire 240, the size of the metal segments 241 ranges from 1.0 μm to 6.0 μm. For example, in FIG. 4, the length of the metal segments 241 in the X direction is 1.0 μm to 6.0 μm. Referring to FIG. 6 again, FIG. 6 is a top view of a metal segment 241 in FIG. 4. The value of the size "a" ranges from 1.0 μm to 6.0 μm, for example, it may be about 1.0 μm, about 2.0 μm, about 3.0 μm, about 4.0 μm, about 5.0 μm, or about 6.0 μm, but the embodiments of the present disclosure are not limited thereto. The size of the elastic conductor segment 242 ranges from 1.0 μm to 6.0 μm. In FIG. 4, the length of the elastic conductor segment 242 in the X direction is 1.0 μm to 6.0 μm, for example, it may be about 1.0 μm, about 2.0 μm, about 3.0 μm, about 4.0 μm, about 5.0 μm, or about 6.0 μm; but the embodiments of the present disclosure are not limited thereto.

Figure 6:
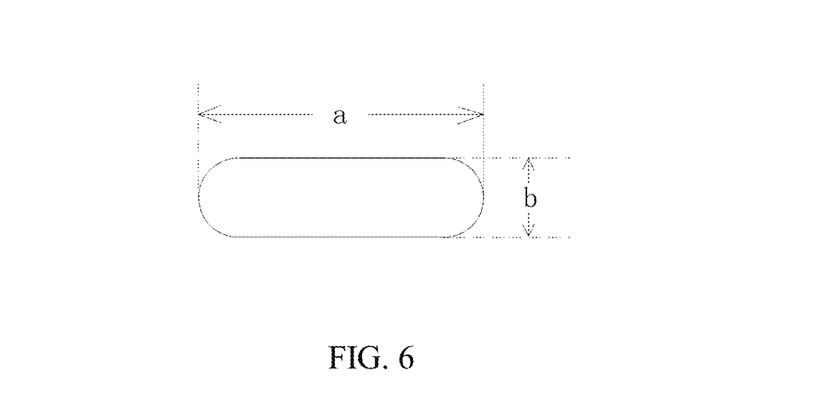
FIG. 6 is an enlarged view of a metal segment in FIG. 4.
Figure 18:
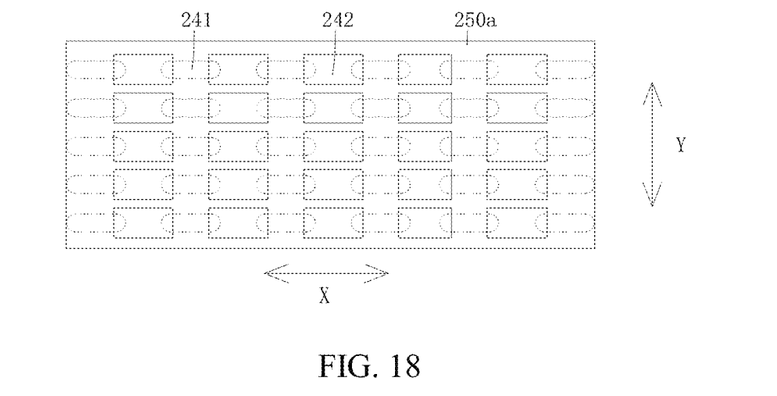
FIG. 18 is a top view of FIG. 17.

Along a direction perpendicular to the extension direction of the wire 240 and a direction perpendicular to the arrangement direction of the first organic layer 230 and the second organic layer 250, the size of the metal segment 241 ranges from 1.0 μm to 6.0 μm, and the size of the elastic conductor segment 242 is 2.4 μm~4 μm. In FIG. 6, the value of the size "b" ranges from 1.0 μm to 6.0 μm, for example, it may be about 1.0 μm, about 2.0 μm, about 3.0 μm, about 4.0 μm, about 5.0 μm, or about 6.0 μm. Referring also to FIG. 18, along the Y direction, the size of the elastic conductor segment 242 is 2.4 μm-4 μm, for example, it may be about 2.4 μm, about 2.7 μm, about 3.0 μm, about 3.5 μm, or about 4 μm.

Along the arrangement direction of the first organic layer 230 and the second organic layer 250, the size of the metal segment 241 ranges from 300 nm to 1200 nm, and the size of the elastic conductor segment 242 ranges from 1.2 nm to 2.4 μm (including the end values). For example, in FIG. 17, along the Z direction, the size of the metal segment 241 ranges from 300 nm to 1200 nm (including the end values), for example, it may be about 300 nm, about 500 nm, about 600 nm, about 750 nm, about 1000 nm, or about 1200 nm; along the Z direction, the size of the elastic conductor segment 242 ranges from 1.2 μm to 2.4 μm, for example, it may be about 1.2 μm, about 1.4 μm, about 1.6 μm, about 1.8 μm, about 2.0 μm, about 2.2 μm, or about 2.4 μm.

In the flexible substrate of the present disclosure, because at least a part of the length of the wire(s) includes metal segments and elastic conductor segments that are alternately arranged, when the flexible substrate is bent, the bridges are bent and deformed, the wire(s) in the bridges is/are bent, and a relative position between two adjacent metal segments is changed with a bending angle of the corresponding elastic conductor segment. Because the elastic conductor segments have good flexibility, they can release the tensile stress or compressive stress caused by the bending bridges, so as to avoid the technical problem that the wires in the bridges are prone to generate cracks due to the bending of the flexible screen; at the same time, the metal segments are arranged between the elastic conductor segments, because the metal segments have a higher electrical conductivity with respect to the elastic conductor segments, which can allow the bridges not to be broken when the bridges are bent, and meanwhile the portions of the wires in which the metal segments and the elastic conductor segments are alternately distributed in the wiring layer to have good conductivity. In addition, because at least a part of the length of each wire has the elastic conductor segments, the elastic conductor segments have better adhesiveness with the first organic layer on one side of the wiring layer and with the second organic layer on the other side of the wiring layer, as compared to the metal segments. In this way, when a bridge is bent under a force, the elastic conductor segments enable the conductors difficult to peel off from the first organic layer and the second organic layer.

Based on the same concept, the embodiments of the present disclosure also provide a method of preparing a flexible substrate.

The method of preparing the flexible substrate includes following operations.

Providing a flexible base substrate 300 including a plurality of display regions 100 distributed in an array.

Providing a bridge region connected between every two adjacent display regions 100.

Figure 7:
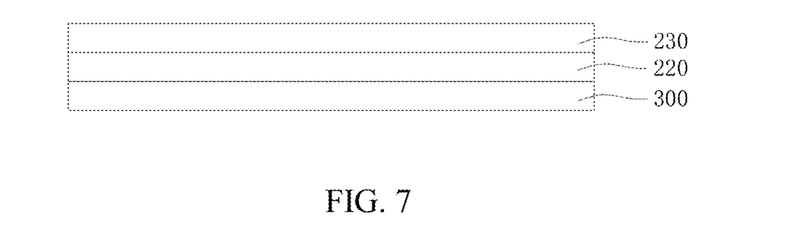
FIG. 7 is a schematic diagram illustrating a structure obtained after step S100 of a preparing method of a flexible substrate provided by an embodiment of the present disclosure.

S100: As shown in FIG. 7, forming a buffer layer 220 and a first organic layer 230, sequentially, on a portion of the flexible base substrate 300 corresponding to the bridge region. The first organic layer 230 can be formed on the buffer layer 220 by spin coating, and then cured by heating (at a temperature of 200° C.~250° C. for a time duration of 10 min~20 min, for example, curing at about 250° C. for about 10 min, curing at about 230° C. for about 15 min, or curing at about 200° C. for about 20 min) or UV curing (with a radiation energy of 2500 mJ~3500 mJ, for example, about 2500 mJ, about 3000 mJ, or about 3500 mJ). For example, the thickness of the buffer layer 220 ranges from 300 nm to 1500 nm, such as about 300 nm, about 500 nm, about 600 nm, about 800 nm, about 1000 nm, about 1300 nm, or about 1500 nm. The thickness of the first organic layer 230 ranges from 0.8 μm to 6 μm, and may be, for example, about 0.8 μm, about 1.2 μm, about 2 μm, about 3 μm, about 4 μm, about 5 μm, and about 6 μm.

In at least a part of the area on the first organic layer 230, a plurality of groups of metal segments are formed. Each group of metal segments includes a plurality of metal segments 241 spaced apart along the extension direction of the bridge region. If the wire 240 to be fabricated has a continuous metal wire for forming the wire 240, a continuous metal wire connected to the ends of each group of metal segments is formed during forming the metal segments.

Figure 8:
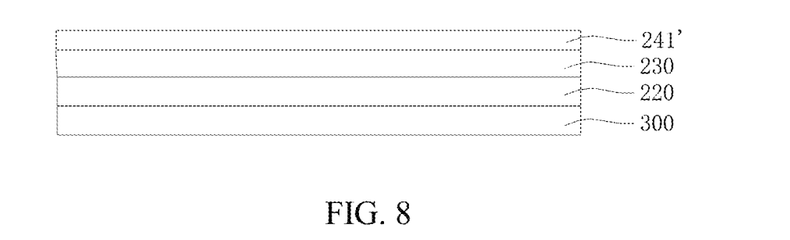
FIG. 8 is a schematic diagram illustrating a structure obtained after step S200 of the preparing method of the flexible substrate provided by an embodiment of the present disclosure.

S200: As shown in FIG. 8, firstly, forming a metal film 241' on the surface of the first organic layer 230 by evaporation or direct current sputtering. For example, the metal film 241' is formed of ITO, Mg/Ag, Al, Ti/Al/Ti, Mo, Mo/Nd/Mo, Ag, Yb, or Au, etc. The thickness of the metal film 241' ranges from 300 nm to 1200 nm. The inventor noticed that if the thickness of the metal film 241' is greater than 1200 nm (not including the end value), the bridge 200 will be too thick, which will not increase the performance but result in waste of material. If the thickness of the metal film 241' is less than 300 nm (not including the end value), it will cause the wire 240 fabricated later to be too thin, with increased resistance and poor strength, which makes it easy to be broken when it is bent.

Figure 9:
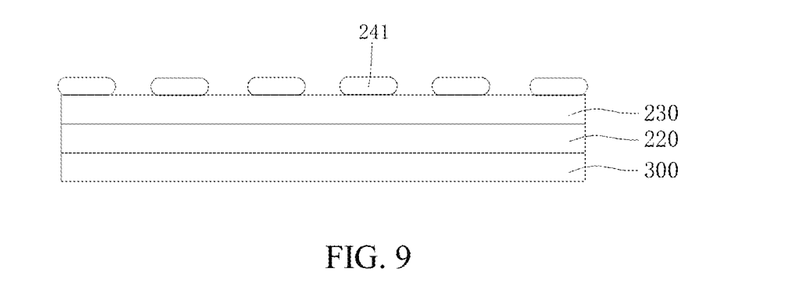
FIG. 9 is a schematic diagram illustrating a structure obtained after step S300 of the preparing method of the flexible substrate provided by an embodiment of the present disclosure.
Figure 10:
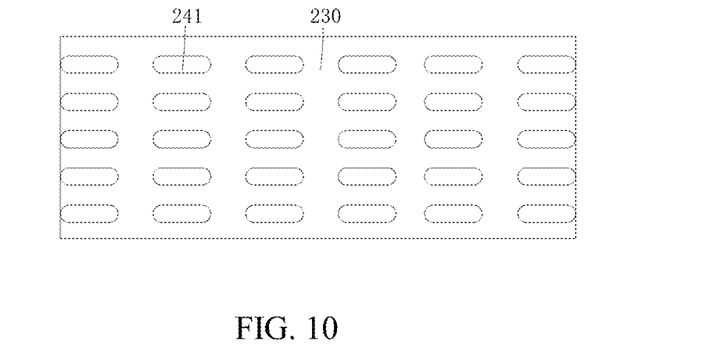
FIG. 10 is a top view of FIG. 9.

S300: As shown in FIGS. 9 and 10, patterning the metal film 241' by an etching process, such as dry etching process, or wet etching process, so that the metal film 241' is formed into a plurality of metal segments 241. These metal segments 241 may be arranged in an array. These metal segments 241 may not be arranged in an array but include a plurality of groups of metal segments 241 arranged side by side. Each group of metal segments 241 includes a plurality of metal segments 241 spaced apart along the extension direction of the bridge 200. For example, when a dry etching process is adopted, the gas used for the dry etching process can be $BCl_3/Cl_2$, $SF_6/Br_2$, or $Cl_2/O_2$.

Figure 11:
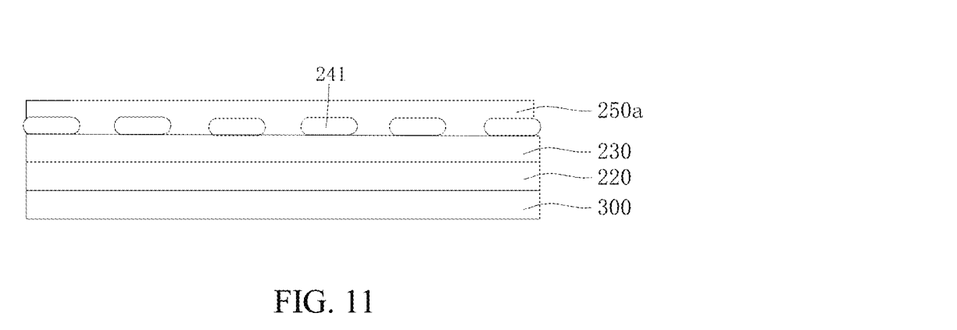
FIG. 11 is a schematic diagram illustrating a structure obtained after step S400 of the preparing method of the flexible substrate provided by an embodiment of the present disclosure.
Figure 12:
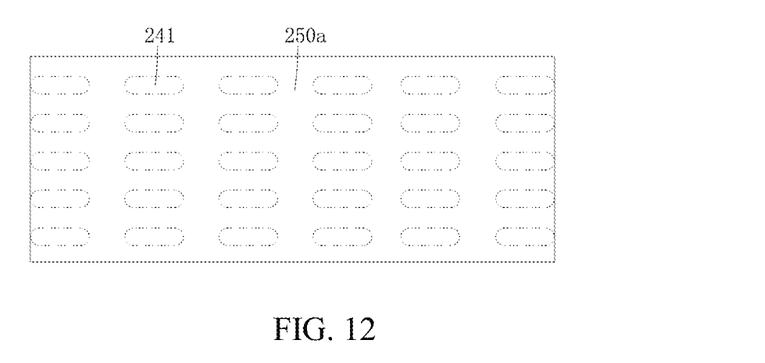
FIG. 12 is a top view of FIG. 11.

S400: As shown in FIGS. 11-12, forming a first sub-organic layer 250a on the first organic layer 230, and the first sub-organic layer 250a covers each group of metal segments 241.

For example, as shown in FIGS. 11 and 12, the first sub-organic layer 250a may be formed on the surface of the first organic layer 230 by spin coating, and then heated and cured (at a temperature of 200° C.~250° C. for a time duration of 10 min~20 min, For example, curing at about 250° C. for about 10 minutes, about 230° C. for about 15 minutes, or about 200° C. for about 20 minutes) or UV-cured (with a radiation energy of 2500 mJ~3500 mJ, for example, about 2500 mJ, about 3000 mJ, or about 3500 mJ). The thickness of the first sub-organic layer 250a ranges from 0.5 μm to 6 μm, for example, it may be about 0.5 μm, about 0.6 μm, about 2 μm, about 3 μm, 5 μm, or about 6 μm.

S500: In each group of metal segments 241, removing a portion of the first sub-organic layer 250a between every two adjacent metal segments 241 to form a first groove 251.

Figure 13:
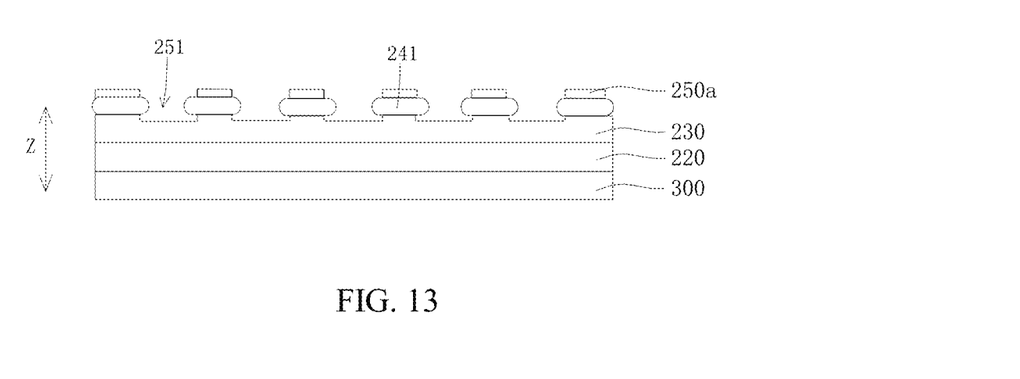
FIG. 13 is a schematic diagram illustrating a structure obtained after step S500 of the preparing method of the flexible substrate provided by an embodiment of the present disclosure.
Figure 14:
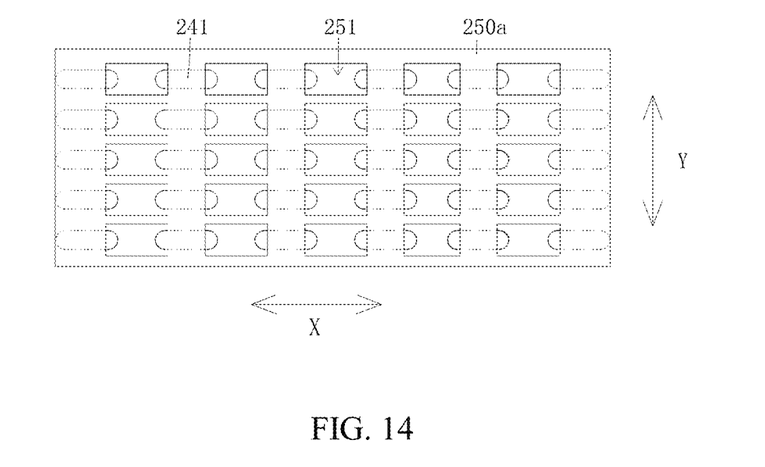
FIG. 14 is a top view of FIG. 13.

As shown in FIGS. 13 and 14, the first sub-organic layer 250a is patterned by exposure, development, etc., to form a first groove 251 between every two adjacent metal segments 241 along the X direction.

Along the extension direction of the wire 240, the size of the first groove 251 ranges from 1.0 μm to 6.0 μm; along the direction perpendicular to the extension direction of the wire 240 and perpendicular to the arrangement direction of the first organic layer 230 and the second organic layer 250, the size of the first groove 251 is 2.4 μm to 4 μm; along the arrangement direction of the first organic layer 230 and the second organic layer 250, the size of the first groove 251 ranges from 1.2 μm to 2.4 μm.

Figure 15:
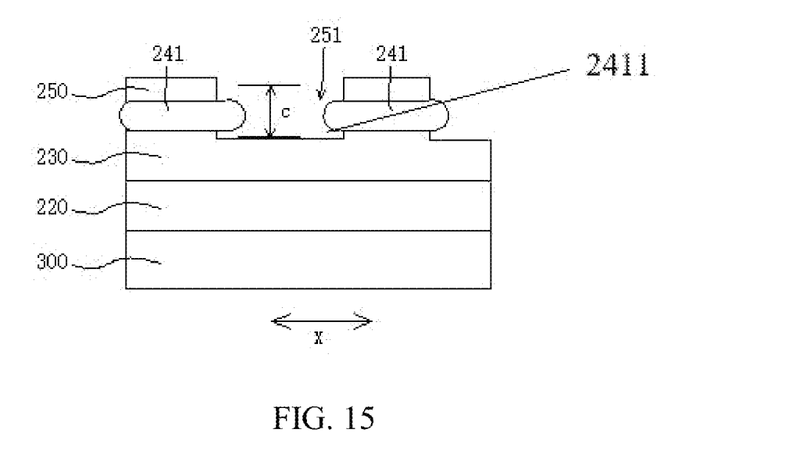
FIG. 15 is an enlarged view of a partial structure in FIG. 13.
Figure 16:
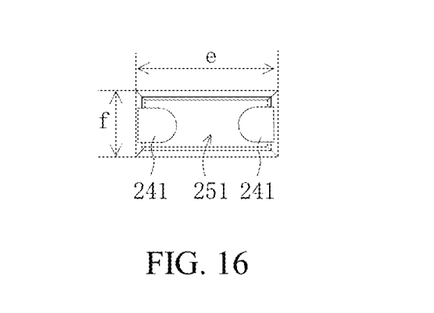
FIG. 16 is a top view of a first groove in FIG. 13.

Referring to FIG. 15, the depth c of the first groove 251 ranges from 1.2 μm to 2.4 μm, for example, it may be about 1.2 μm, about 1.4 μm, about 1.6 μm, about 1.8 μm, about 2.0 μm, about 2.2 μm, or about 2.4 μm. Referring to FIG. 16, the size "e" of the first groove 251 ranges from 1 μm to 6 μm, and may be, for example, about 1.0 μm, about 2.0 μm, about 3.0 μm, about 4.0 μm, about 5.0 μm, or about 6.0 μm. The size "f" ranges from 2.4 μm to 4 μm, and may be, for example, about 2.4 μm, about 2.7 μm, about 3.0 μm, about 3.5 μm, or about 4 μm.

Forming an elastic conductor segment 242 in the first groove 251 to connect two adjacent metal segments 241.

Figure 17:
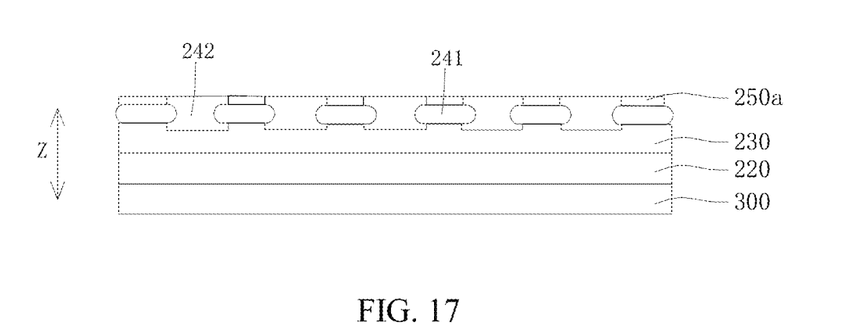
FIG. 17 is a schematic diagram illustrating a structure obtained after step S600 of the preparing method of the flexible substrate provided by an embodiment of the present disclosure.

S600: As shown in FIG. 17 and FIG. 18, an ink-jet printing method may be utilized to place a conductive material, which will possess elasticity after being cured, into the corresponding first groove 251, and then the conductive material is cured to form an elastic conductor segment 242. For example, a heating-curing method (at a heating temperature of 200° C.~250° C. for a time duration of 45 min~75 min, for example, curing at about 250° C. for about 45 min, about 230° C. for about 60 min, or about 200° C. for about 75 min) or a UV-curing method (with a radiation energy of 5500 mJ-7000 mJ, for example, about 5500 mJ, about 6000 mJ, or about 7000 mJ) may be adopted to form the elastic conductor segment 242.

For example, the elastic conductor segments 242 can also be formed by the following method: depositing and curing a conductive material, which will possess elasticity after being cured, on the first sub-organic layer 250a; exposing and developing a part of the conductive material deposited into the first grooves 251; and removing the conductive material which is located outside the first grooves 251 and is located on the surface of the first sub-organic layer 250a.

Figure 19:
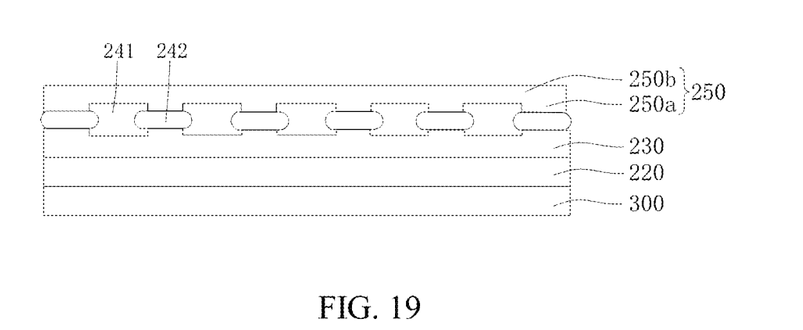
FIG. 19 is a schematic diagram illustrating a structure obtained after step S700 of the preparing method of the flexible substrate provided by an embodiment of the present disclosure.
Figure 20:
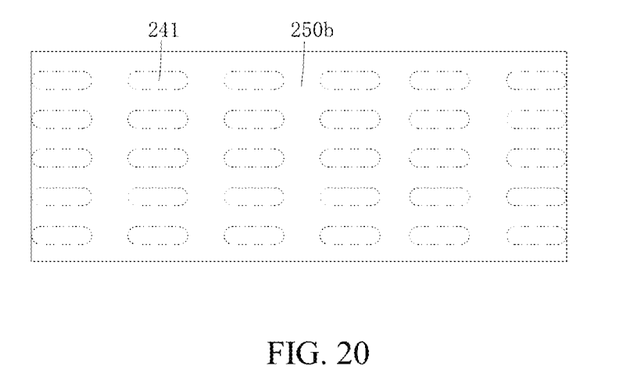
FIG. 20 is a top view of FIG. 19.

S700: As shown in FIGS. 19 and 20, forming a second sub-organic layer 250b on the surface of the first sub-organic layer 250a. The second sub-organic layer 250b covers the elastic conductor segments 242; and the first sub-organic layer 250a and the second sub-organic layer 250b form a second organic layer 250.

The second sub-organic layer 250b can be formed on the surface of the first organic layer 230 by spin coating, and then is heated and cured (at a temperature of 200° C.~250° C. for a time duration of 10 min~20 min, for example, curing at about 250° C. for about 10 min, curing at about 230° C. for about 15 minutes, or curing at about 200° C. for about 20 minutes) or UV-cured (with a radiation energy of 2500 mJ~3500 mJ, for example, about 2500 mJ, about 3000 mJ, or about 3500 mJ). The thickness of the first sub-organic layer 250a ranges from 0.8 μm to 6 μm, for example, it may be about 0.8 μm, about 2 μm, about 3 μm, about 5 μm, or about 6 μm.

Figure 21:
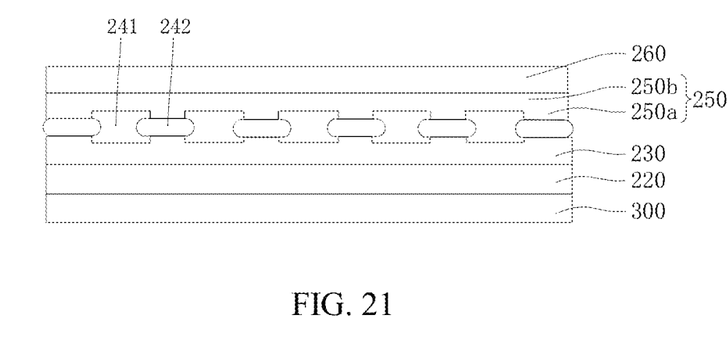
FIG. 21 is a schematic diagram illustrating a structure obtained after step S800 of the preparing method of the flexible substrate provided by an embodiment of the present disclosure.

S800: As shown in FIG. 21, forming an inorganic layer 260 on the surface of the second sub-organic layer 250b.

In the above-described preparing method of the flexible substrate, firstly, a plurality of groups of metal segments 241 are formed on the first organic layer 230, each group of metal segments 241 includes a plurality of metal segments 241 spaced apart along the extension direction of the bridge region; and then in each group of metal segments 241, an elastic conductor segment 242 is formed between every two adjacent metal segments 241, so as to form the wire 240 in the aforementioned flexible substrate.

In the flexible substrate formed by this method, because at least a part of the length of the wire(s) includes metal segments and elastic conductor segments that are alternately arranged, when the flexible substrate is bent, the bridge is bent and deformed, the wire(s) in the bridge is/are bent, and a relative position between two adjacent metal segments is changed with a bending angle of the elastic conductor segment. Because the elastic conductor segments have good flexibility, they can release the tensile stress or compressive stress caused by the bending bridges, so as to avoid the technical problem that the wires in the bridges are prone to generate cracks due to the bending of the flexible screen; at the same time, the metal segment is arranged between every two adjacent elastic conductor segments, because the metal segment has a higher electrical conductivity with respect to the elastic conductor segments, which can allow the bridge not to be broken when the bridge is bent, and meanwhile the portions of the wires in which the metal segments and the elastic conductor segments are alternately distributed in the wiring layer to have good conductivity. In addition, because at least a part of the length of the wire(s) has the elastic conductor segments, the elastic conductor segments have better adhesiveness with the first organic layer on one side of the wiring layer and with the second organic layer on the other side of the wiring layer, as compared to the metal segments. In this way, when a bridge is bent under a force, the elastic conductor segments make the conductors difficult to peel off from the first organic layer and the second organic layer.

In an example, when the first groove 251 is formed, the first organic layer 230 is over-etched to form an undercut structure 2411 at both ends of the metal segment 241 along the extension direction of the bridge region. Referring to FIG. 15, the upper surface of the first organic layer 230 between every two adjacent metal segments 241 is over-etched. Along the X direction, a part of the first organic layer 230 on the bottom side of each end of the metal segment 241 is also etched away, while the end of each metal segment 241 and the top surface of the first organic layer 230 are formed with the undercut structure 2411, so that when the first groove 251 is filled with the conductive material to form the elastic conductor segment 242, the ends of the metal segments 241 can be embedded in the elastic conductor segment 242 to improve the connection strength between the metal segments 241 and the elastic conductor segment 242.

Based on the same concept, as an alternative to the first preparing method, a plurality of groups of elastic conductor segments 242 may be formed on the first organic layer 230 firstly, in which each group of elastic conductor segments 242 includes a plurality of elastic conductor segments 242 spaced apart along the extension direction of the bridge region; and then a metal segment 241 is formed between every two adjacent elastic conductor segments 242 in each group of elastic conductor segments 242, so as to form the wire 240 in the aforementioned flexible substrate. The flexible substrate formed by this method has the same advantages as the flexible substrate formed by the aforementioned method.

For example, the preparing method of the flexible substrate includes following operation.

Providing a flexible base substrate 300 including a plurality of display regions 100 arranged in an array.

Forming a bridge region between every two adjacent display regions 100.

Forming a buffer layer 220 and a first organic layer 230 sequentially on a portion of the flexible base substrate corresponding to the bridge region.

Forming a plurality of groups of elastic conductor segments 242 on the first organic layer 230 firstly, in which each group of elastic conductor segments 242 includes a plurality of elastic conductor segments 242 spaced apart along the extension direction of the bridge region.

Forming a third organic sub-layer on the first organic layer 230, in which the third organic sub-layer covers each group of elastic conductor segments 242.

In each group of elastic conductor segments 242, removing a portion of the third sub-organic layer between every two adjacent elastic conductor segments 242 to form a second groove.

Forming a metal segment 241 in the second groove to connect two adjacent elastic conductor segments 242.

Forming a fourth sub-organic layer on the surface of the third sub-organic layer, in which the fourth sub-organic layer covers the metal segment 241, and the third sub-organic layer and the fourth sub-organic layer form a second organic layer 250.

Furthermore, forming an inorganic layer 260 on the surface of the fourth sub-organic layer.

Based on the same concept, the embodiment of the present application also provides a display panel including the above-mentioned flexible substrate.

In the flexible substrate used in the above-mentioned display panel, because at least a part of the length of the wire(s) 240 includes metal segments 241 and elastic conductor segments 242 that are alternately arranged, when the flexible substrate is bent, the bridge 200 is bent and deformed, the wire(s) 240 in the bridge 200 is/are bent, and a relative position between two adjacent metal segments 241 is changed with a bending angle of the elastic conductor segment 242. Because the elastic conductor segment 242 has good flexibility, it can release the tensile stress or compressive stress caused by the bending bridge 200, so as to avoid the technical problem that the wire(s) 240 in the bridge 200 is/are prone to generate cracks due to the bending of the flexible screen; at the same time, the metal segment 241 is arranged between the elastic conductor segments 242, because the metal segment 241 has a higher electrical conductivity with respect to the conductor segments 242, which can allow the bridge 200 not to be broken when the bridge 200 is bent, and meanwhile the portions of the wires 240 in which the metal segments 241 and the elastic conductor segments 242 are alternately distributed in the wiring layer 24 to have good conductivity. In addition, because at least a part of the length of the wire(s) 240 has the elastic conductor segments 242, the elastic conductor segments 242 have better adhesiveness with the first organic layer 230 on one side of the wiring layer 24 and with the second organic layer 250 on the other side of the wiring layer 24, as compared to the metal segment 241. In this way, when the bridge 200 is bent under a force, the arrangement of the elastic conductor segments 242 also make the conductors difficult to peel off from the first organic layer 230 and the second organic layer 250.

Based on the same concept, embodiments of the present application also provides a display device including the above-mentioned display panel.

In the flexible substrate used in the above-mentioned display device, because at least a part of the length of the wire(s) 240 includes metal segments 241 and elastic conductor segments 242 that are alternately arranged, when the flexible substrate is bent, the bridge 200 is bent and deformed, the wire(s) 240 in the bridge 200 is/are bent, and a relative position between two adjacent metal segments 241 is changed with a bending angle of the elastic conductor segment 242. Because the elastic conductor segments 242 have good flexibility, they can release the tensile stress or compressive stress caused by the bending bridge 200, so as to avoid the technical problem that the wire(s) 240 in the bridge 200 is/are prone to generate cracks due to the bending of the flexible screen; at the same time, the metal segment 241 is arranged between the elastic conductor segments 242, because the metal segment 241 has a higher electrical conductivity with respect to the conductor segments 242, which can allow the bridge 200 not to be broken when the bridge 200 is bent, and meanwhile the portions of the wire(s) 240 in which the metal segments 241 and the elastic conductor segments 242 are alternately distributed in the wiring layer 24 to have good conductivity. In addition, because at least a part of the length of the wire(s) 240 has the elastic conductor segments 242, the elastic conductor segments 242 have better adhesiveness with the first organic layer 230 on one side of the wiring layer 24 and with the second organic layer 250 on the other side of the wiring layer 24, as compared to the metal segments 241. In this way, when the bridge 200 is bent under a force, the elastic conductor segments 242 make the conductors difficult to peel off from the first organic layer 230 and the second organic layer 250.

The following points should be noted:

1) The accompanying drawings involve only the structure(s) in connection with the embodiment(s) of the present disclosure, and other structure(s) can be referred to common design(s).

2) Without conflicting with each other, features in one embodiment or in different embodiments can be combined to obtain new embodiment(s), the new embodiment(s) shall also belong to the scope of the present disclosure.

The described above is only the exemplary embodiments of the present disclosure, and the scope of the present disclosure is not limited thereto. A person of ordinary skill in the art can make various changes and modifications without departing from the technical scope of the embodiments of the present disclosure, and such changes and modifications shall fall into the scope of the present disclosure.

What is claimed is:

1. A flexible substrate, comprising a flexible base substrate, the flexible base substrate comprising a plurality of display regions in an array and bridges connecting every two adjacent display regions, wherein
each of the plurality of display regions is configured to arrange a pixel structure;
each of the bridges comprises a buffer layer, a first organic layer, a wiring layer, a second organic layer, and an inorganic layer that are arranged in sequence, wherein the wiring layer is provided with a wire; and
in at least a part of a length of the wire, along an extension direction of the wire, the wire comprises metal segments and elastic conductor segments that are alternately arranged;
wherein each bridge comprises a first curved portion, a second curved portion and a linear portion connecting the first curved portion and the second curved portion, the wire in each curved portion is curved and the wire in the linear portion extends along a straight line, and the first curved portion of the bridge is connected to a top end of a first display region and opened towards the first display region of the plurality of display regions, the second curved portion of the bridge is connected to a bottom end of a second display region and opened towards the second display region of the plurality of display regions.

2. The flexible substrate according to claim 1, wherein each of the bridges comprises a bent portion and a linear extension portion, wherein a part of the wire in the bent portion comprises the metal segments and the elastic conductor segments that are alternately arranged, and a part of the wire in the linear extension portion is formed by a continuous metal wire.

3. The flexible substrate according to claim 1, wherein ends of each metal segment extend into a corresponding one of the elastic conductor segments.

4. The flexible substrate according to claim 1, wherein the elastic conductor segments have a cross-sectional area larger than a cross-sectional area of the metal segments.

5. The flexible substrate according to claim 4, wherein the cross-sectional area of the elastic conductor segments is 3.5 times to 4.5 times of the cross-sectional area of the metal segments.

6. The flexible substrate according to claim 1, wherein each elastic conductor segment comprises an organic conductor and conductive particles distributed in the organic conductor.

7. The flexible substrate according to claim 6, wherein the organic conductor comprises at least one of a conductive rubber or a conductive resin; and
the conductive particles comprise at least one of silver nanoparticles, gold nanoparticles, silver nanowires, Ir—Sn nanowires, Ir—Ag nanotubes, Pt—Sn nanowires, or zinc nanowires.

8. The flexible substrate according to claim 1, wherein, along the extension direction of the wire, a ratio of a size of the metal segments to a size of the elastic conductor segments ranges from 0.9 to 1.5.

9. The flexible substrate according to claim 1, wherein, along the extension direction of the wire, a size of the metal segments ranges from 1.0 µm to 6.0 µm, and a size of the elastic conductor segments ranges from 1.0 µm to 6.0 µm;
along a direction perpendicular to the extension direction of the wire and a direction perpendicular to an arrangement direction of the first organic layer and the second organic layer, the size of the metal segments ranges from 1.0 µm to 6.0 µm, and the size of the elastic conductor segments ranges from 2.4 µm to 4 µm; and
along the arrangement direction of the first organic layer and the second organic layer, the size of the metal segments ranges from 300 nm to 1200 nm, and the size of the elastic conductor segments ranges from 1.2 µm to 2.4 µm.

10. A method of preparing a flexible substrate, comprising:
providing a flexible base substrate, the flexible base substrate being formed with a plurality of display regions in an array;
forming a bridge region between every two adjacent display regions, wherein forming the bridge region comprises:
sequentially forming a buffer layer and a first organic layer on a portion of the flexible base substrate corresponding to the bridge region;
forming a plurality of groups of metal segments on the first organic layer, wherein each of the plurality of groups of metal segments comprises a plurality of metal segments spaced apart along an extension direction of the bridge region;
forming a first sub-organic layer on the first organic layer, wherein the first sub-organic layer covers each group of metal segments;
in each group of metal segments, removing a portion of the first sub-organic layer between every two adjacent metal segments to form a first groove;
forming an elastic conductor segment in the first groove to connect two adjacent metal segments, wherein the metal segments and the elastic conductor segments are alternately arranged to form a wire;

forming a second organic sub-layer on a surface of the first organic sub-layer, wherein the second organic sub-layer covers the elastic conductor segment, and wherein the first organic sub-layer and the second organic sub-layer form a second organic layer; and forming an inorganic layer on a surface of the second sub-organic layer;

wherein each bridge region comprises a first curved portion, a second curved portion and a linear portion connecting the first curved portion and the second curved portion, the wire in each curved portion is curved and the wire in the linear portion extends along a straight line, and the first curved portion of the bridge is connected to a top end of a first display region and opened towards the first display region of the plurality of display regions, the second curved portion of the bridge is connected to a bottom end of a second display region and opened towards the second display region of the plurality of display regions.

11. The preparing method of the flexible substrate according to claim 10, further comprising over-etching the first organic layer during forming the first groove, so as to form an undercut structure at both ends of each metal segment along the extension direction of the bridge region.

12. The preparing method of the flexible substrate according to claim 10, wherein, along an extension direction of the wire, the first groove has a size ranging from 1.0 μm to 6.0 μm;

along a direction perpendicular to the extension direction of the wire and a direction perpendicular to an arrangement direction of the first organic layer and the second organic layer, the size of the first groove is 2.4 μm-4 μm; and along the arrangement direction of the first organic layer and the second organic layer, the size of the first groove ranges from 1.2 μm to 2.4 μm.

13. A method of preparing a flexible substrate, comprising:

providing a flexible base substrate, the flexible base substrate being formed with a plurality of display regions in an array;

forming a bridge region between every two adjacent display regions, wherein forming the bridge region comprises:

sequentially forming a buffer layer and a first organic layer on a portion of the flexible base substrate corresponding to the bridge region;

forming a plurality of groups of elastic conductor segments on the first organic layer, wherein each of the plurality of groups of elastic conductor segments comprises a plurality of elastic conductor segments spaced apart along an extension direction of the bridge region;

forming a third sub-organic layer on the first organic layer, wherein the third sub-organic layer covers each group of elastic conductor segments;

in each group of elastic conductor segments, removing a portion of the third sub-organic layer between every two adjacent elastic conductor segments to form a second groove;

forming a metal segment in the second groove to connect two adjacent elastic conductor segments, wherein the metal segments and the elastic conductor segments are alternately arranged to form a wire;

forming a fourth sub-organic layer on a surface of the third sub-organic layer, wherein the fourth sub-organic layer covers the metal segment, and wherein the third sub-organic layer and the fourth sub-organic layer form a second organic layer; and forming an inorganic layer on a surface of the fourth sub-organic layer;

wherein each bridge region comprises a first curved portion, a second curved portion and a linear portion connecting the first curved portion and the second curved portion, the wire in each curved portion is curved and the wire in the linear portion extends along a straight line, and the first curved portion of the bridge is connected to a top end of a first display region and opened towards the first display region of the plurality of display regions, the second curved portion of the bridge is connected to a bottom end of a second display region and opened towards the second display region of the plurality of display regions.

14. A display panel, comprising the flexible substrate according to claim 1.

15. A display device, comprising the display panel according to claim 14.

16. The flexible substrate according to claim 2, wherein ends of each metal segment extend into a corresponding one of the elastic conductor segments.

17. The flexible substrate according to claim 16, wherein the elastic conductor segments have a cross-sectional area larger than a cross-sectional area of the metal segments.

18. The flexible substrate according to claim 17, wherein the cross-sectional area of the elastic conductor segments is 3.5 times to 4.5 times of the cross-sectional area of the metal segments.

19. The flexible substrate according to claim 18, wherein each elastic conductor segment comprises an organic conductor and conductive particles distributed in the organic conductor.

20. The flexible substrate according to claim 19, wherein the organic conductor comprises at least one of a conductive rubber or a conductive resin; and the conductive particles comprise at least one of silver nanoparticles, gold nanoparticles, silver nanowires, Ir—Sn nanowires, Ir—Ag nanotubes, Pt—Sn nanowires, or zinc nanowires.

* * * * *